US012787847B2

(12) United States Patent
Signorini et al.

(10) Patent No.: US 12,787,847 B2
(45) Date of Patent: Nov. 3, 2026

(54) INTEGRATING AND ACCESSING PASSIVE COMPONENTS IN WAFER-LEVEL PACKAGES

(71) Applicant: Intel Corporation, Santa Clara, CA (US)

(72) Inventors: Gianni Signorini, Garching bei Muenchen (DE); Veronica Sciriha, Munich (DE); Thomas Wagner, Regelsbach (DE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/374,582

(22) Filed: Sep. 28, 2023

(65) Prior Publication Data

US 2024/0030175 A1 Jan. 25, 2024

Related U.S. Application Data

(63) Continuation of application No. 18/128,077, filed on Mar. 29, 2023, now Pat. No. 12,308,335, which is a
(Continued)

(51) Int. Cl.
*H10W 74/01* (2026.01)
*H10P 72/70* (2026.01)
(Continued)

(52) U.S. Cl.
CPC ........... *H10W 74/019* (2026.01); *H10P 72/74* (2026.01); *H10W 70/05* (2026.01); *H10W 70/09* (2026.01);
(Continued)

(58) Field of Classification Search
CPC ............. H01L 23/5386; H01L 23/5383; H01L 23/5389; H01L 21/486; H01L 24/82;
(Continued)

(56) References Cited

U.S. PATENT DOCUMENTS 9,425,149 B1 8/2016 Jiang
9,633,977 B1 4/2017 We
(Continued)

FOREIGN PATENT DOCUMENTS

JP 2001-102512 4/2001
WO WO-2014-022418 2/2014

OTHER PUBLICATIONS

International Search Report and Written Opinion for International Patent Application No. PCT/US2017/054533 mailed Jun. 21, 2018, 15 pgs.
(Continued)

*Primary Examiner* — Marlon T Fletcher
*Assistant Examiner* — Christina A Sylvia
(74) *Attorney, Agent, or Firm* — Schwabe, Williamson & Wyatt, P.C.

(57) ABSTRACT

In accordance with disclosed embodiments, there is a method of integrating and accessing passive components in three-dimensional fan-out wafer-level packages. One example is a microelectronic die package that includes a die, a package substrate attached to the die on one side of the die and configured to be connected to a system board, a plurality of passive devices over a second side of the die, and a plurality of passive device contacts over a respective passive die, the contacts being configured to be coupled to a second die mounted over the passive devices and over the second side of the die.

18 Claims, 13 Drawing Sheets

Related U.S. Application Data continuation of application No. 16/635,146, filed as application No. PCT/US2017/054533 on Sep. 29, 2017, now Pat. No. 11,646,288.

(51) Int. Cl.

| | |
|---|---|
| ***H10W 70/05*** | (2026.01) |
| ***H10W 70/09*** | (2026.01) |
| ***H10W 70/60*** | (2026.01) |
| ***H10W 70/65*** | (2026.01) |
| ***H10W 70/685*** | (2026.01) |
| ***H10W 74/10*** | (2026.01) |
| *H10W 70/652* | (2026.01) |

(52) U.S. Cl.

CPC ........ *H10W 70/093* (2026.01); *H10W 70/611* (2026.01); *H10W 70/614* (2026.01); *H10W 70/65* (2026.01); *H10W 70/685* (2026.01); *H10W 74/016* (2026.01); *H10W 74/117* (2026.01); *H10P 72/7436* (2026.01); *H10W 70/6528* (2026.01)

(58) Field of Classification Search

CPC ............... H01L 225/06586; H01L 225/06548; H10W 74/019; H10W 70/05; H10W 70/09; H10W 70/093; H10W 70/611; H10W 70/614; H10W 70/65; H10W 70/685; H10W 74/016; H10W 74/117; H10W 70/6528; H10W 72/874; H10W 74/00; H10W 70/60; H10W 72/252; H10W 70/635; H10W 72/00; H10W 74/01; H10W 90/00; H10P 72/74; H10P 72/7436; H10P 72/743

See application file for complete search history.

(56) References Cited

U.S. PATENT DOCUMENTS

| | | | | |
|---|---|---|---|---|
| 9,859,245 | B1 * | 1/2018 | Chen | H01L 23/49827 |
| 10,410,694 | B1 | 9/2019 | Uzoh | |
| 2004/0238857 | A1 | 12/2004 | Beroz | |
| 2006/0001179 | A1 | 1/2006 | Fukase | |
| 2008/0174008 | A1 | 7/2008 | Yang | |
| 2012/0126417 | A1 | 5/2012 | Chung | |
| 2013/0087887 | A1 | 4/2013 | Kim | |
| 2014/0185264 | A1 | 7/2014 | Chen | |
| 2014/0203395 | A1 | 7/2014 | Tsai | |
| 2015/0001731 | A1 | 1/2015 | Shuto | |
| 2015/0171063 | A1 * | 6/2015 | Zhai | H01L 25/50 257/713 |
| 2015/0200182 | A1 * | 7/2015 | Wang | H01L 25/50 257/774 |
| 2015/0243575 | A1 * | 8/2015 | Strothmann | H01L 24/96 257/734 |
| 2015/0348873 | A1 * | 12/2015 | Katkar | H01L 24/46 438/666 |
| 2015/0380377 | A1 | 12/2015 | Uzoh | |
| 2016/0181211 | A1 | 6/2016 | Kamgaing | |
| 2016/0200566 | A1 | 7/2016 | Ofner | |
| 2016/0254245 | A1 | 9/2016 | Wasserman | |
| 2016/0260695 | A1 | 9/2016 | Chung | |
| 2016/0343685 | A1 * | 11/2016 | Lin | H01L 23/5389 |
| 2016/0343694 | A1 | 11/2016 | Lin | |
| 2016/0379921 | A1 | 12/2016 | Shin | |
| 2017/0170134 | A1 | 6/2017 | Audet | |
| 2017/0317053 | A1 * | 11/2017 | Hung | H01L 25/0652 |
| 2017/0345761 | A1 | 11/2017 | Yu | |
| 2017/0373050 | A1 | 12/2017 | Shao | |
| 2018/0122772 | A1 * | 5/2018 | Kim | H01L 25/105 |
| 2018/0226378 | A1 * | 8/2018 | Hung | H01L 24/83 |
| 2019/0139911 | A1 | 5/2019 | Gutierrex, III | |

OTHER PUBLICATIONS

International Preliminary Report on Patentability for International Patent Application No. PCT/US2017/054533 mailed Apr. 9, 2020, 11 pgs.

Office Action for U.S. Appl. No. 18/128,077 mailed Apr. 24, 2024, 15 pgs.

Office Action for U.S. Appl. No. 18/128,077 mailed Oct. 16, 2024, 20 pgs.

Notice of Allowance for U.S. Appl. No. 18/128,077 mailed Feb. 4, 2025, 11 pgs.

* cited by examiner

100

INTEGRATING AND ACCESSING PASSIVE COMPONENTS IN WAFER-LEVEL PACKAGES

CROSS-REFERENCE TO RELATED APPLICATION

This patent application is a continuation of U.S. patent application Ser. No. 18/128,077, filed Mar. 29, 2023, which is a continuation of U.S. patent application Ser. No. 16/635,146, filed Jan. 29, 2020, now U.S. Pat. No. 11,646,288, issued May 9, 2023, which is a U.S. National Phase Application under 35 U.S.C. § 371 of International Application No. PCT/US2017/054533, filed Sep. 29, 2017, entitled "INTEGRATING AND ACCESSING PASSIVE COMPONENTS IN WAFER-LEVEL PACKAGES," which designates the United States of America, the entire disclosure of which are hereby incorporated by reference in their entirety and for all purposes.

FIELD

The subject matter described herein relates generally to the field of semiconductor and electronics manufacturing, and more particularly, a method of integrating and accessing passive components in three-dimensional fan-out wafer-level packages.

BACKGROUND

In modern mobile computing systems, PCB area and volume reduction is becoming one of the most important drivers for technology innovation and is currently pushing semiconductor design and manufacturing companies to discover and develop innovative ideas to improve and increase integration levels.

Multiple dies and/or semiconductor packages can be stacked on top of each other. These are referred to as system-in-package (SIP), package-on-package (POP), etc. For die-stacking, a combination of flip-chip and wire-bonding technology will often coexist. In order to minimize package thickness, thinner conductive and dielectric layers are used in the package substrate. In other words, layer count of the package substrate is often minimized.

Wafer-level packages significantly reduce the overall package thickness, exchanging the package substrate (~150/200 um thickness) with a limited number of thin Re-Distribution Layers (RDL) and thin dielectrics. Package stacking is also used in the context of wafer-level technology. This is made possible using Through-Mold-Vias (TMV), often also called Through-Encapsulation-Vias (TEV).

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also correspond to embodiments of the claimed subject matter.

BRIEF DESCRIPTION OF THE DRAWINGS

Embodiments are illustrated by way of example, and not by way of limitation, and will be more fully understood with reference to the following detailed description when considered in connection with the figures in which.

DETAILED DESCRIPTION

Described herein is a method of integrating and accessing passive components in three-dimensional fan-out wafer-level packages. The described semiconductor package construction simultaneously enables die-stacking and passive discrete component embedding capability. This offers minimum footprint/volume occupation and optimal electrical performances. In particular, embedded discrete passive surface-mount-technology (SMT) components can be placed in the mold region of the bottom package, and can be directly accessed by the top package solder balls.

A method is described to construct stacked wafer-level semiconductor packages capable of simultaneously embedding multiple silicon dies and discrete passive SMT components. In embodiments, the discrete passive SMT components are placed within the molding area of the bottom package. Alternatively, or in addition, they are placed within the region where Through-Mold/Encapsulation-VIAs (TMV/TEV) are placed. Discrete passive SMT components, fixed in the bottom-package molding, can be placed in order to align their solder pads with the top-package BGAs. The discrete passive SMT components that are placed within TMV/TEV regions are able to serve for either or both the bottom and top dies.

An innovative and effective process is described herein to build stacked wafer-level semiconductor packages, offering the simultaneous capability of both die-stacking and passive discrete SMT component placement. The construction results in minimal PCB area and volume occupations.

When passive components, such as coils and capacitors are mounted directly to the package substrate, a considerable amount of surface area may be required. The mounting location also requires limitations in terms of maximum and minimum electrical parameters of the passives structures. As an example the maximum inductance for integrated inductors is limited. In addition, dangerous mutual unwanted couplings with other functional system sub-components are likely to arise. When passive components are placed inside the substrate on the same metal layer of a package substrate that is used for soldering a silicon die, the same limitations arise. While the passives are somewhat embedded, surface area is still required on the substrate.

In some cases, the discrete components are placed on a separate carrier above the die. The carrier is then mounted as if it were a stacked die in a POP construction. For larger dies, the parasitic resistance and inductance associated with such a placement introduces significant resistive and inductive parasitics. As an example, for decoupling capacitors, such a placement easily results in increased power supply-impedance values.

Figure 1:
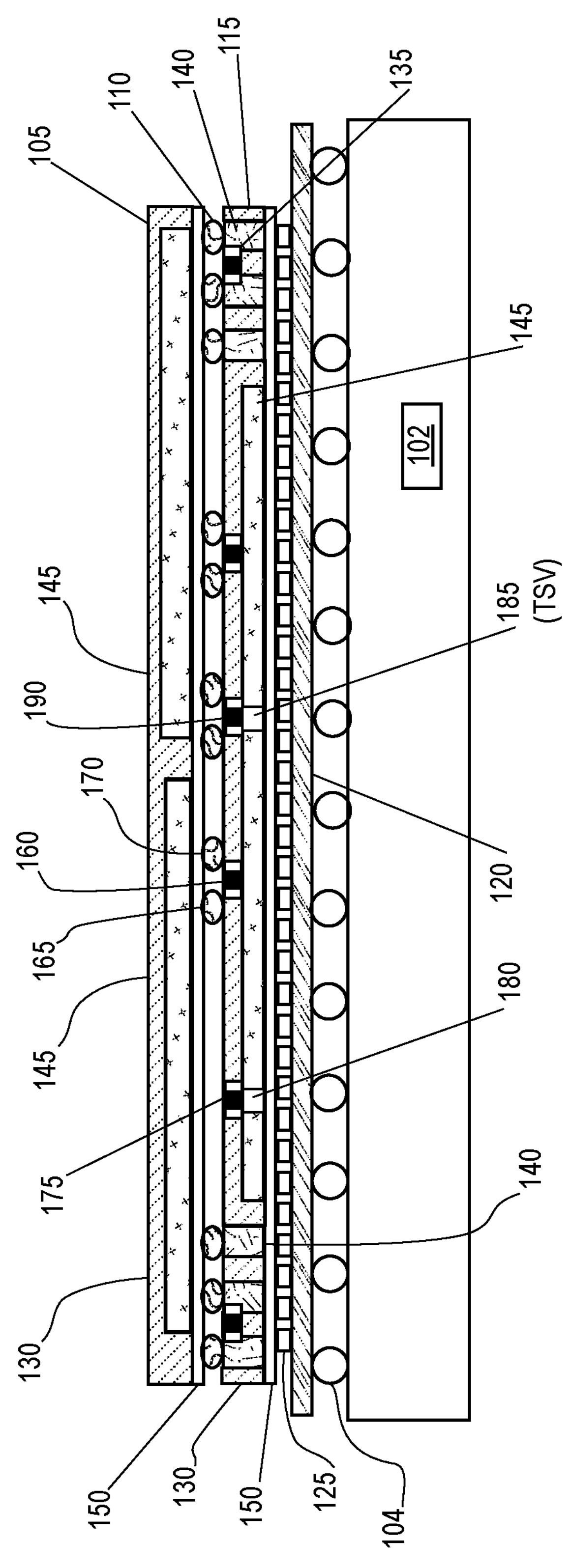
FIG. 1 is a cross-sectional side view diagram of a multiple die package stack with integrated passive devices according to an embodiment.

FIG. 1 is a cross-sectional side view diagram of a multiple die package stack with integrated passive devices. The die in the stack may allow it to perform as a complete system or as a part of a later system. The device 100 is configured to be mounted to a system board 102, mother board, or logic board with a solder ball, land grid or other connection array 104 in order to couple to external devices, such as user interface and communication components and to power. In this example, there are three micromechanical or microelectronic dies 145 mounted to a package substrate 120. The package substrate may have an attachment and connection system such as a solder ball array or ball grid array (BGA) 104 or another connection system to mount to a system. The three dies may be a processor and memory, communications, power regulation, input/output hub or one or more other components. The three dies may be multiple processors, an imaging system, or other suitable combination of dies.

A bottom package 115 has one or more dies 145 of which only one is shown. A redistribution layer (RDL) or substrate 150 is attached to the bottom side of the die to connect to lands or pads of the die and make connections to a solder ball or ball grid array 125 on the redistribution layer opposite the die. The BGA is in turn attached to the package substrate 120 to electrically couple the bottom die to the system board or other supporting structure. The die is further covered in a molding compound 130 or encapsulant to seal and isolate the die and to provide a support for the RDL.

A second or top package 105 is attached to the bottom package 115 over the top mold compound. The top package has two dies 145 in this example placed side-by-side. A second RDL 150 is formed under the two dies for the top package and is configured to allow the dies to be coupled to each other, if appropriate, and to be coupled to the bottom package. The dies of the top package are also covered in a second mold compound 130 or otherwise encapsulated. A solder ball grid or array 110 is attached to the bottom of the top package RDL to connect the top package to the top of the bottom package. There may be additional components, packages, shields, and other parts to the stacked package structure, depending on the requirements of the particular implementation.

The bottom package includes additional features in order to support passive devices or other components to enhance the stack of packages. One or more passive devices 160 are placed over the die 145 of the bottom package 115. In this example the devices are shown as capacitors with a left and right terminal and a dielectric element in between. Other types of passive devices may be mounted in the same or a similar way, such as inductors, resistors, diodes, etc. The passive device 160 is isolated from the die by the thick dielectric of the silicon substrate that forms the back side of the die that is facing the passive device. There may also be an additional layer on the back side of the die between the die and the passive device. The device may be attached with solder, adhesive, resin, or another material.

The passive device 160 is surrounded by the mold compound 130 that covers the back side of the die 145. This electrically isolates passive devices from each other and allows the passive devices to be placed closer to each other. Solder balls 165, 170 are each placed directly over one of the two terminals of the passive device. If the passive device has more than two terminals, then more solder balls may be used. These solder balls electrically connect to the two exposed terminals of the passive device 160 on one side. On the other side the solder balls connect to the RDL 150 of the top package 105. This direct connection to the RDL allows the passive device to be connected to either one of the dies of the top package with a very short connection through the RDL. The short distance reduces a variety of parasitic electric effects caused by long connections. There may be many different passive devices attached to the back side of the bottom die to serve different purposes of the dies of the top package.

Instead of being coupled to the top package, at least some of the passive devices such as the device identified as 175 are attached to the back side of the bottom die and then coupled to the front side circuitry of the bottom package 115 die. TSVs (Through Silicon Vias) 180 may be through the back side of the bottom die 145 to connect to the active circuitry (not shown) on the front side of the die. The TSVs may be configured so that the terminals of a passive device 175 align with the tops of the TSVs. In this way the passive may connect directly with the bottom die without using any surface area of the package 115 that is not already used for the die 145.

Other passive devices 190 may be coupled through solder balls and the RDL 150 to a die 145 of the top package 105 and also through TSVs 185 to the die of the bottom package. This allows the passive device to affect communications between the dies. Accordingly, the position of the passive device between the top and bottom package allows the passive device to connect to either one or both of the packages. In addition, the passive device may connect through TSVs on the back side of a die or through solder balls to the front side of the die. While the top package is shown as having an RDL to connect to the passive device, depending on the configuration of the top die, the passive device may connect through solder balls directly to the front side of the die. In other words, the top package may not have an RDL or a portion of one of the dies may be exposed for connection to a passive device. While the illustrated package stack has both packages with dies mounted with the front side facing down in a flip chip configuration and connected directly to a lower RDL, one or more of the dies of either package may be flipped. In such a case, a passive device may connect to an upper die through TSVs instead of directly through the RDL. In another such case, a passive device may connect to a bottom die through an RDL.

The bottom package may also include embedded passive devices 135 apart from the bottom die. While some of the passive devices are attached to the back side of the bottom die, other passive devices are placed in the package in another area that does not include the bottom die. This allows the passive device to be connected downwards to the RDL or substrate of the bottom package without interference from the bottom die. Alternatively, or in addition, it allows the passive device to connect to a die of the upper package that is not over the die of the bottom package. The passive device is embedded in the mold compound in the same way that the other passive device are embedded in the mold compound, but in this case, the passive device is not mounted to or carried by the die of the bottom package but by the mold compound. TMVs (Through Mold Vias) or TEVs (Through-Encapsulant Vias) 140 connect the passive device directly to the lower RDL. Solder balls 110 may be used in the same way as described above to connect the passive device to a die of the top package.

The outboard passive devices are particularly well suited to connections between the top package and the system board below the bottom package. Such connections are particularly appropriate for power for which the passive devices may form power regulation and conditioning circuits. Such connections may also be used for data and control signals. Alternatively, the connections may be used to connect a top package die to a bottom package die through the bottom package RDL or package substrate.

Figure 2:
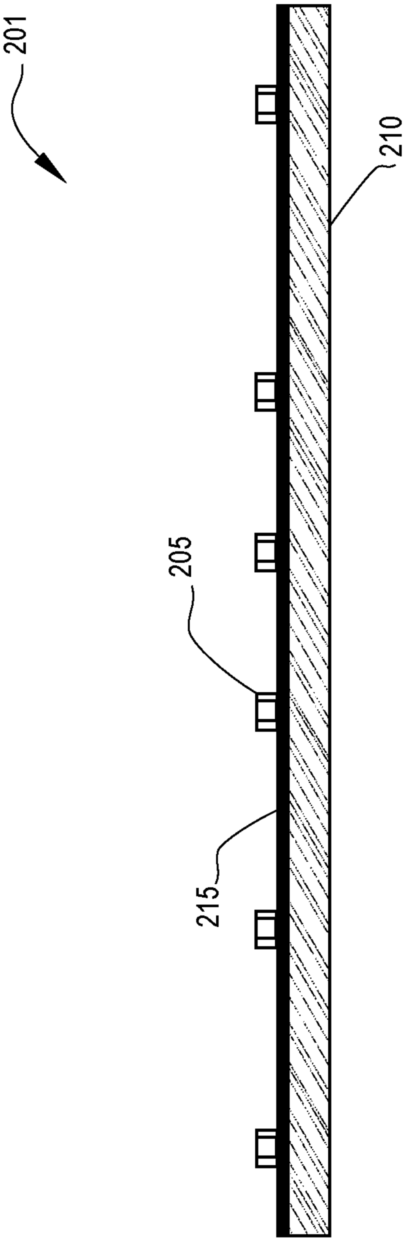
FIGS. 2-13 are cross-sectional side view diagrams of fabrication stages for forming the bottom package of the stacked package structure of FIG. 1 according to embodiments.

FIGS. 2-13 are cross-sectional side view diagrams of fabrication stages for forming the bottom package of the stacked package structure of FIG. 1 according to embodiments. The process begins in FIG. 2 with a structure 201 that has already started. FIG. 2 shows a temporary carrier 210 formed of glass, silicon, ceramic or any other suitable rigid material. The carrier is covered with a copper layer 215 and any number of components 205 are attached to the carrier using e.g. surface mount technology (SMT). These components may be the passive devices discussed above and other devices. The copper film may be applied by deposition or direct application and the passives may be attached with a shooter, dispenser or other device and then soldered on to the copper film.

Figure 3:
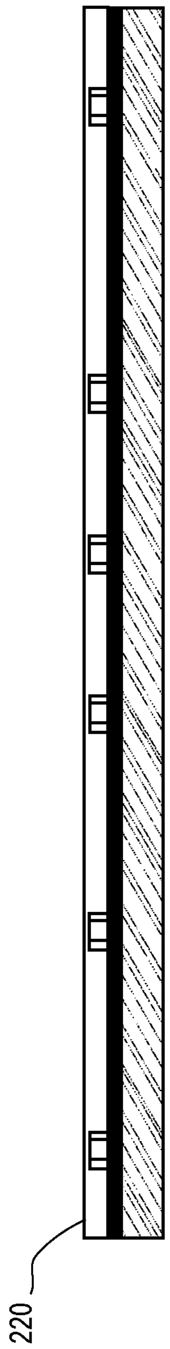

FIG. 3 shows the structure in a later stage of fabrication after a layer of dielectric 220 has been grown over the temporary carrier. This dielectric may be any suitable material that is easily removed without harming the carrier, conductive layers, and metal structures. The dielectric is formed so that the top surface, as shown, is level or is close to level. In other words, the top of the dielectric provides a planar or substantially planar mounting surface for the die of the bottom package. The top surface may also be shaped or machined by grinding, milling, polishing or etching to be level or shaped or formed in any other desired way.

The passive devices and other components may have different heights. Some of the devices may be of a different type than other devices so that they have different dimensions. Even when the devices are all built to the same standard and specifications, there may be manufacturing variations causing some to be higher than others. The dielectric layer compensates for these differences covering all of the passive devices so that the top surface is level and provides a suitable mounting surface. The tallest passive device will, accordingly, be at or near the top surface of the dielectric while the shortest passive device will be covered in the mold compound.

Figure 4:
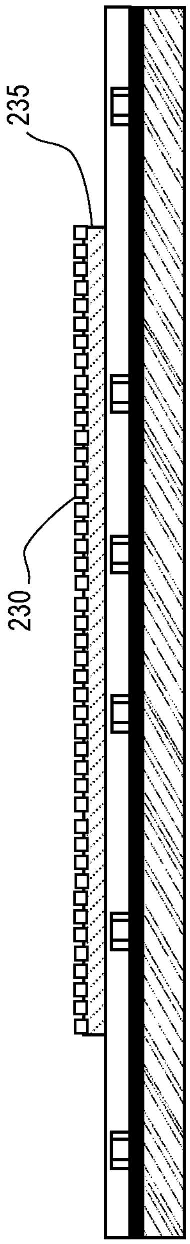

FIG. 4 shows the structure with the die 235 of the bottom package attached over the tops of the passive components and over the temporary carrier. The die 235 is shown as having a back side facing the passive components 205 and the level dielectric layer 220. The opposite front side or face side faces up and has a die pad 230, such as an array of posts.

Figure 5:
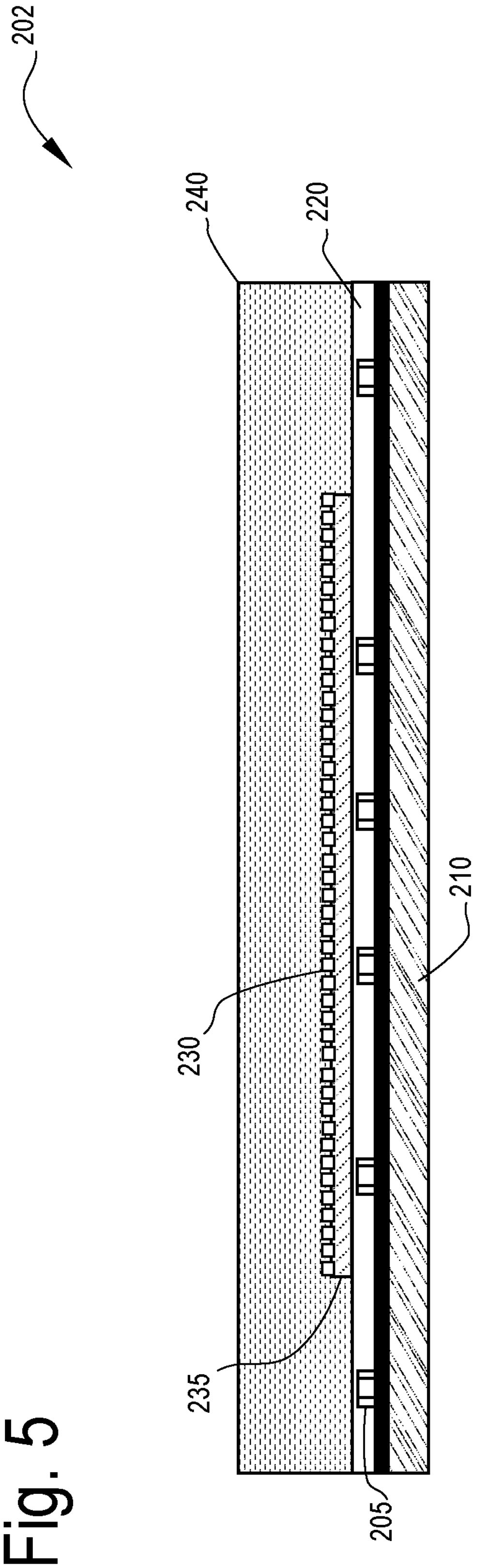

FIG. 5 shows the structure of FIG. 4 now with a dielectric layer 240 that has been deposited or grown over the die 235 and copper posts 230 and over the temporary carrier around the edges or periphery of the die.

Figure 6:
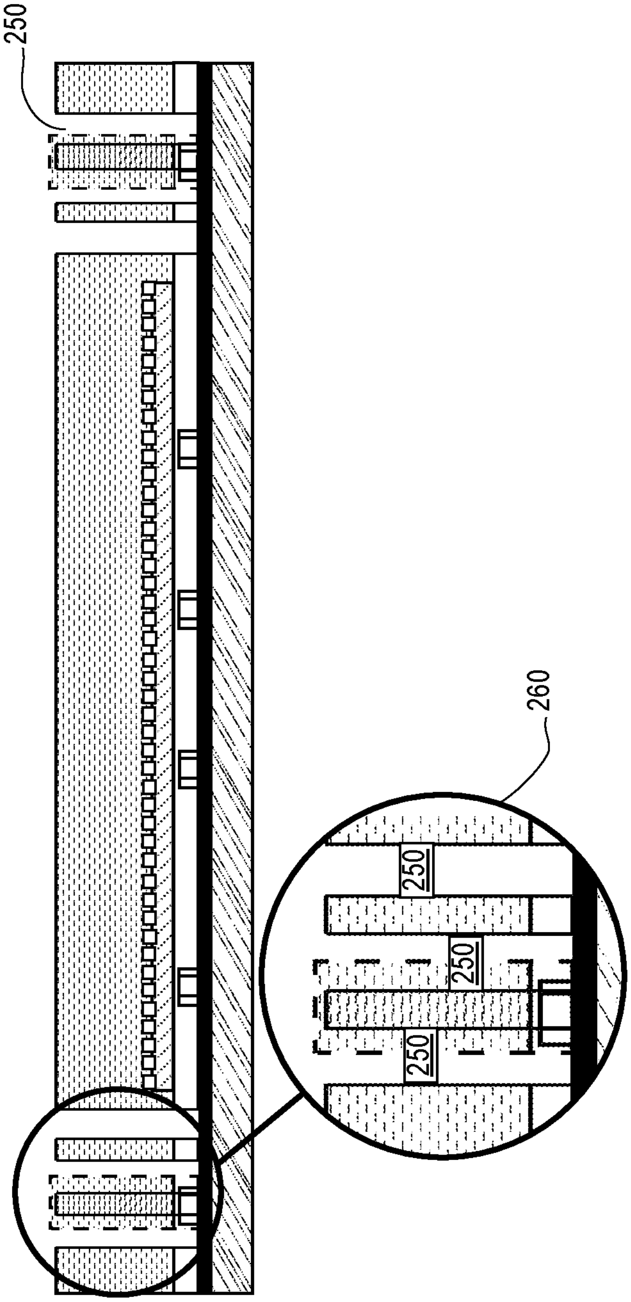
Figure 7:
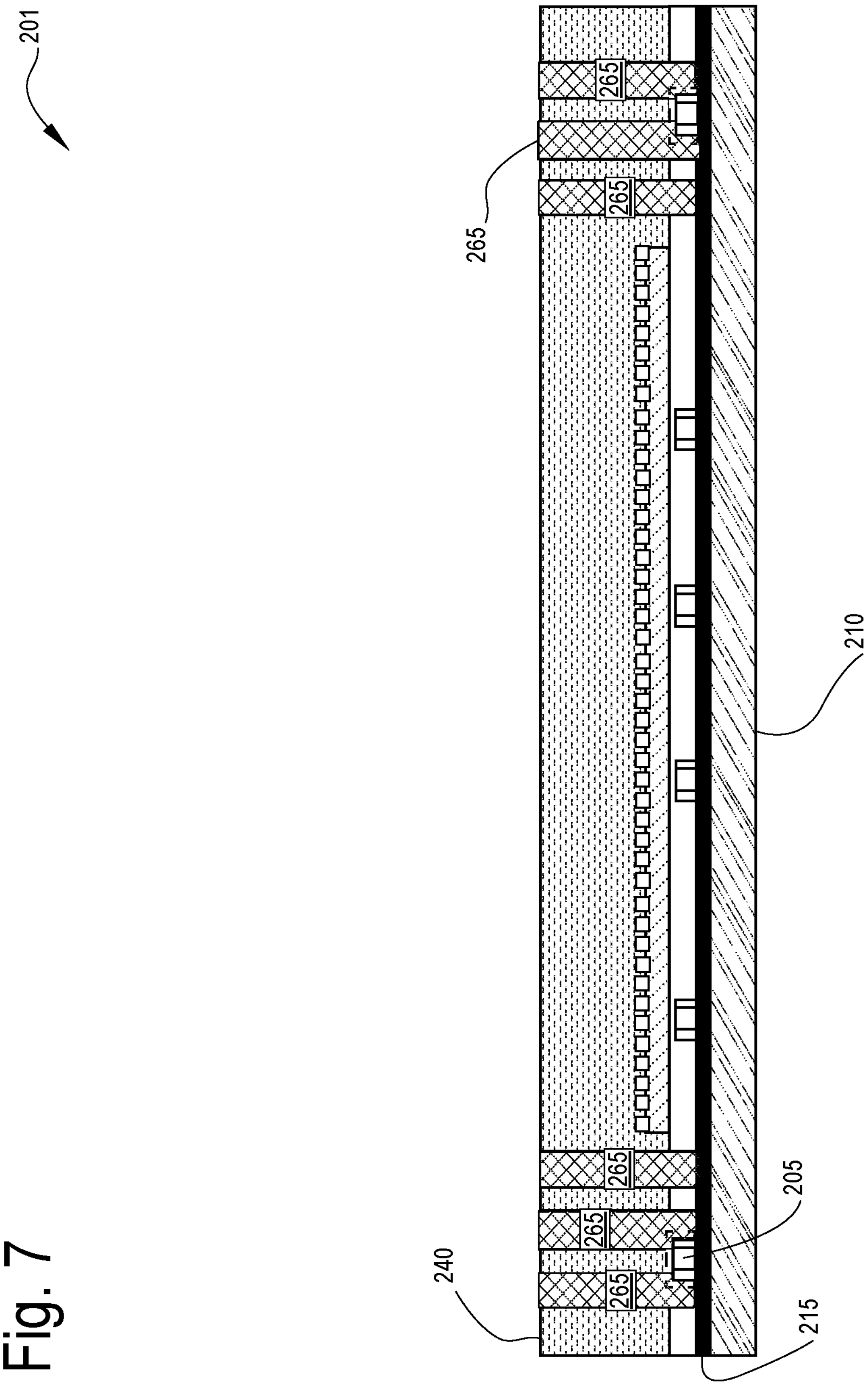

FIG. 6 shows the structure after recesses 250 are etched through the dielectric. Some of the trenches, holes or recesses are applied to form a hole directly through the top dielectric to the temporary carrier. In other cases, they are aligned to expose the terminals of passive components. FIG. 7 shows the structure in which the holes or recesses 250 are filled with a conductor such as copper to form TMVs or TEVs 265. The conductive pillars of e.g. copper are grown on top of the existing copper film 215. The TMVs are locally depopulated where the discrete passive SMT components are mounted.

Figure 8:
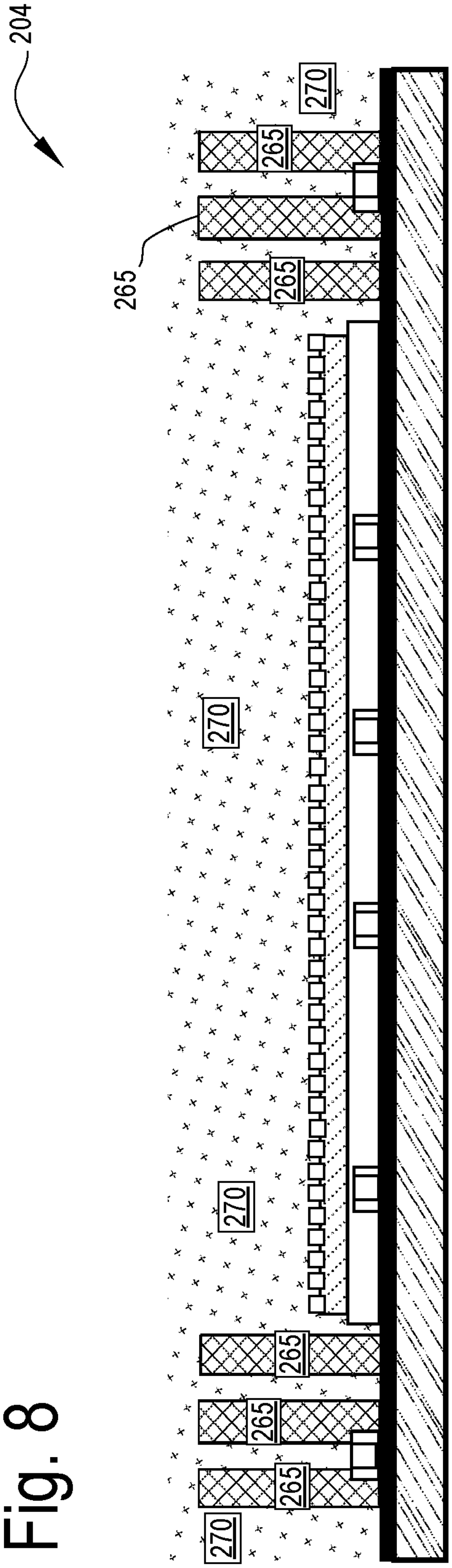
Figure 9:
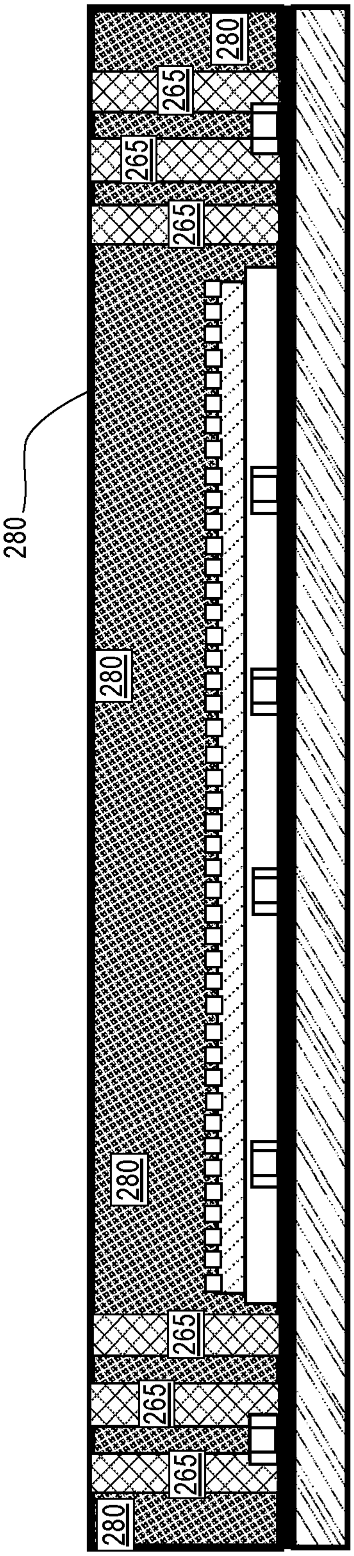
Figure 10:
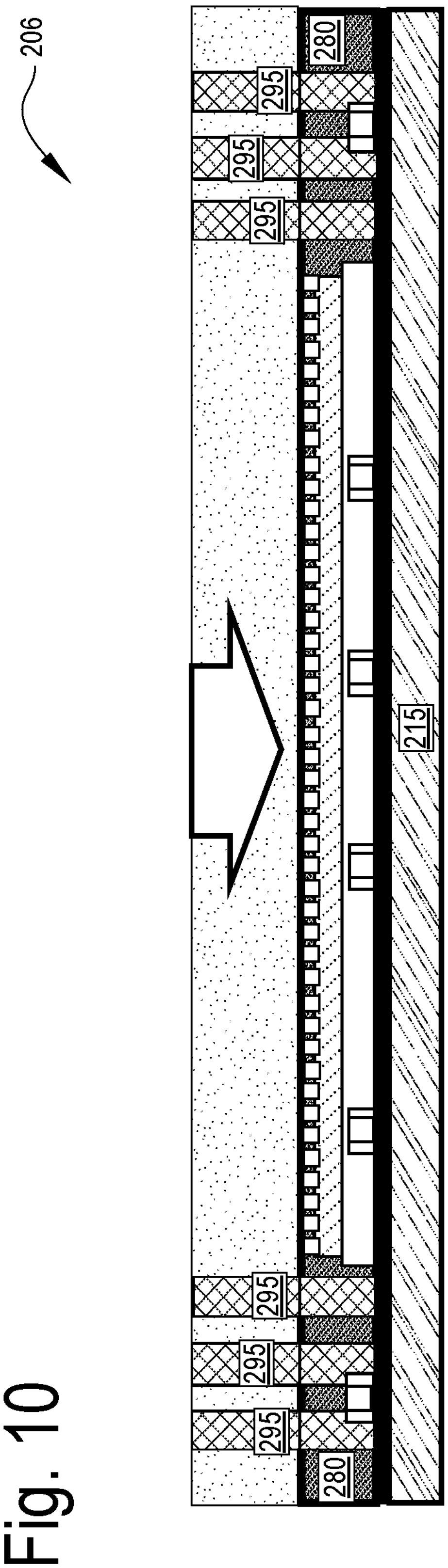
Figure 11:
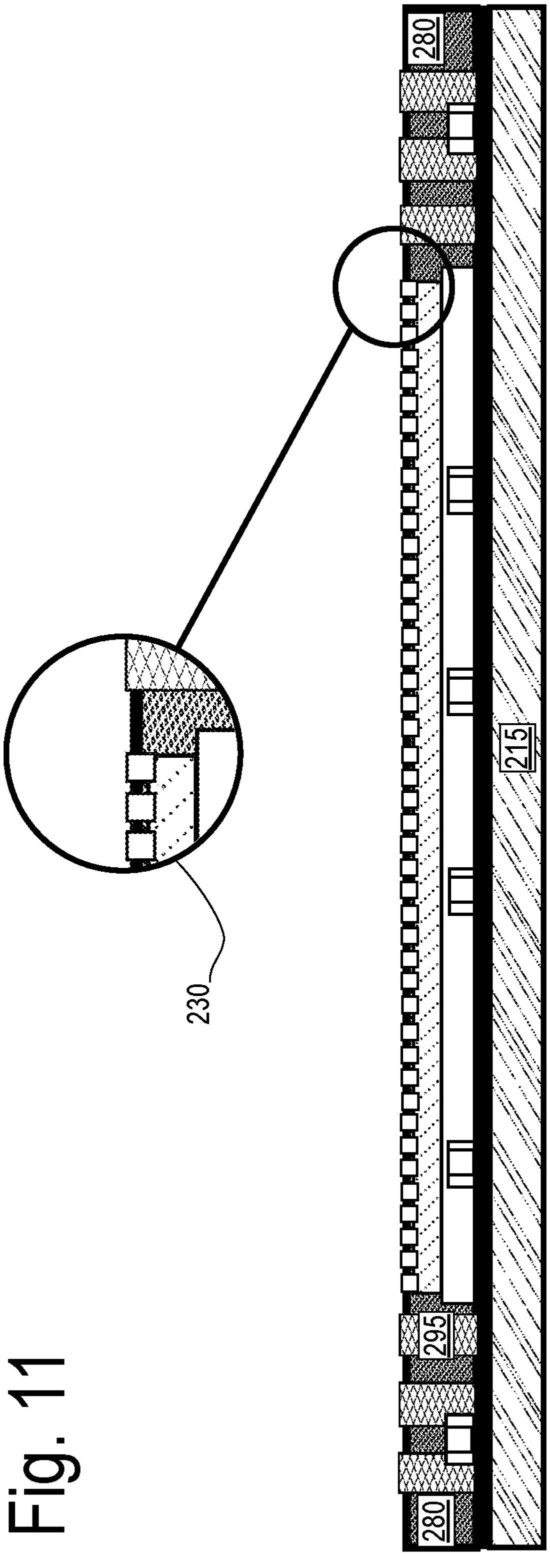

FIG. 8 shows the structure at a next stage after the dielectric is removed. The copper posts 265, 230 are surrounded by and exposed to an open air or ambient 270 environment. FIG. 9 shows the structure after the entire structure is covered in a mold compound or an encapsulant 280. Any of a variety of over-molding processes may be used. FIG. 10 shows that grinding is applied to the top surface of the mold as indicated by the arrow. This reduces the overall height of the structure 206. The grinding also reduces the heights of the copper posts 295 and the pillars of the die pad 230. FIG. 11 shows the structure after the grinding is completed. A mold flash process has also been applied so that the copper pillars and the posts of the die pad are exposed. The mold flash may be performed using e.g. plasma etching.

The mold or molding compound may be formed of any of a variety of different materials, depending on the nature of the package and its intended use. Suitable mold compounds may include, or may consist of, a plastic material, such as a thermosetting polymer or an epoxy resin or a filled epoxy resin such as a thermosetting mold compound. Alternatively, an underfill or other material may be used to protect the die.

Figure 12:
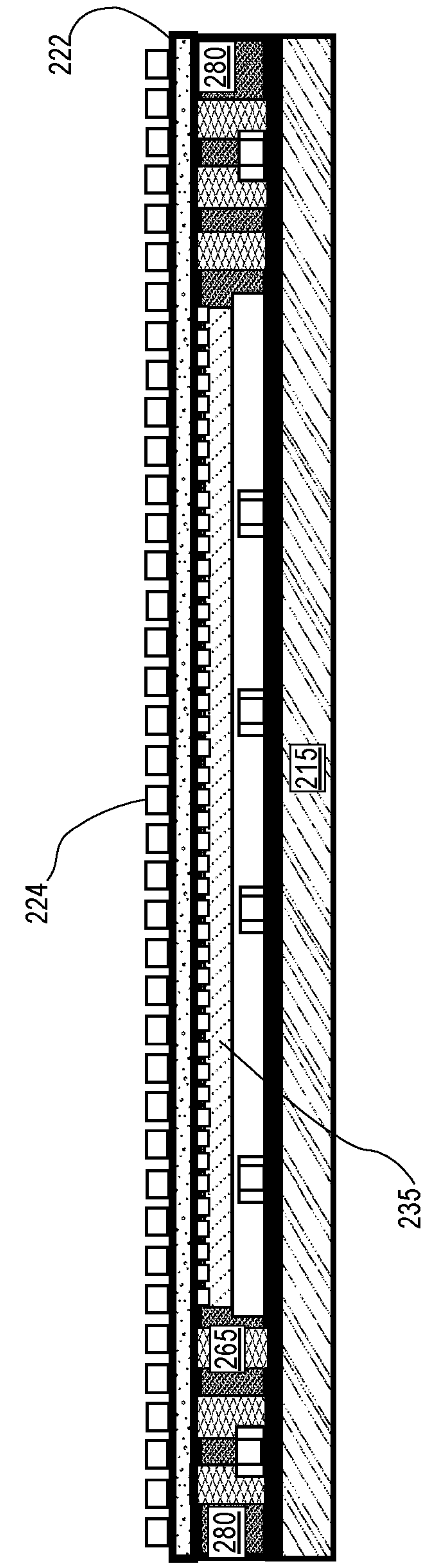

FIG. 12 shows the structure after an RDL 220 has been applied and then copper traces, lands, or pads are formed on the RDL. These are then connected with a solder ball array 224 that is placed over the lands or pad of the RDL. The RDL connects to the copper pillars from the die 235 and from the TMVs 265. These connections are re-routed through the layers of the RDL in order to make connections to a system board through the solder balls. The molding compound 280 that surrounds the die remains in place.

The RDL may have a first dielectric layer closest to the chip, a conductor layer with metal pathways, and a solder stop layer. The chip is connected to the metal pathways by vias through the first dielectric layer. The metal pathways may be formed of any of a variety of different metals including copper, aluminum, titanium, tungsten, nickel, palladium, gold, or of metal alloys including one or more of copper, aluminum, titanium, tungsten, nickel, palladium, and gold.

Figure 13:
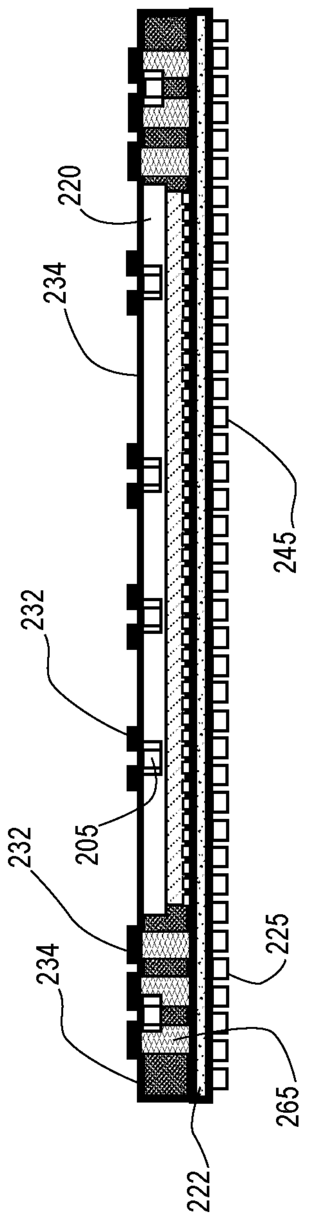

FIG. 13 shows the structure inverted so that the RDL 220 and the solder balls 225 are now at the bottom of the image. This flipping of the image reflects a system in which processes are applied only to the top of the structure. The actual position of the structure may be adapted to suit particular implementations. In addition, the temporary carrier 215 of the previous figures is removed exposing the passive devices 205 and the dielectric layer that was deposited around the passive devices. Solder pads 232 are applied over at least some of the passive devices on each terminal. These solder pads will later be used to connect to the dies of the top package. Solder pads may also be applied over the TMVs as appropriate for the particular package design.

The pads over the passives and TMVs may be formed in a variety of different ways depending on the implementation. As an example, a clean layer of copper 234 may be applied e.g. by chemical vapor deposition or atomic layer deposition over the entire surface 220 after the temporary carrier is removed. If the original copper layer 215 is intact, then that layer may be used. In some embodiments, the copper layer is then patterned to form the desired pads using photoresist patterning and etching to remove the unwanted copper areas.

These operations complete the bottom package. The bottom surface has a solder ball array 225 to attach to a system board or any other suitable structure. The top surface has lands 235 that allow any of a variety of parts or package to attach to the inner passive devices 205 and the external vias 265. This bottom package provides the advantages of offering very short direct passive device connections to an upper device without increasing the height of the bottom package significantly.

Figure 14:
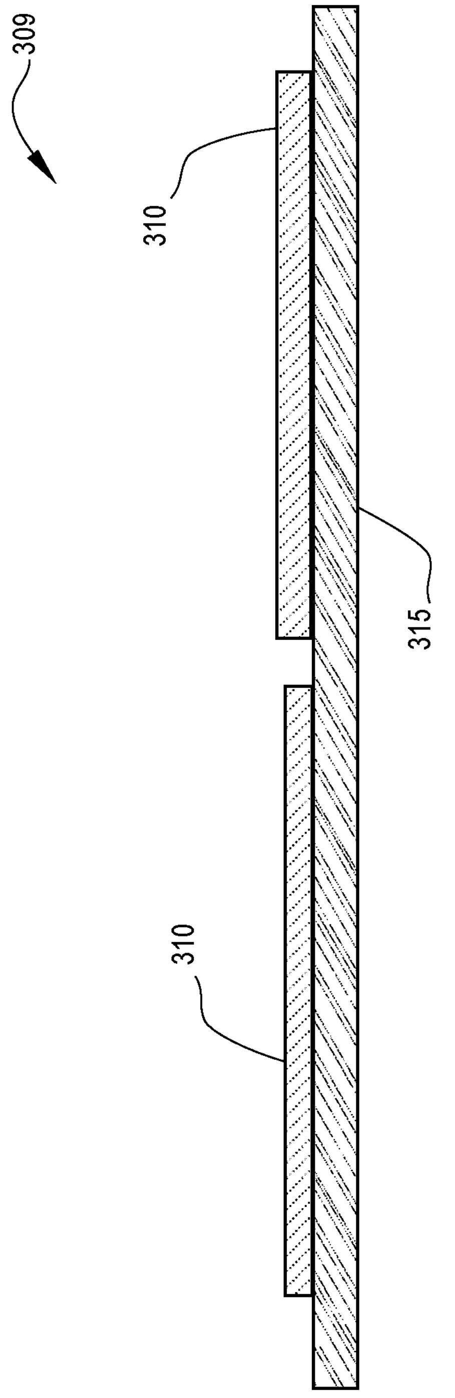
FIGS. 14-16 are cross-sectional side view diagrams of fabrication stages for forming the top package of the stacked package structure of FIG. 1 according to embodiments.
Figure 15:
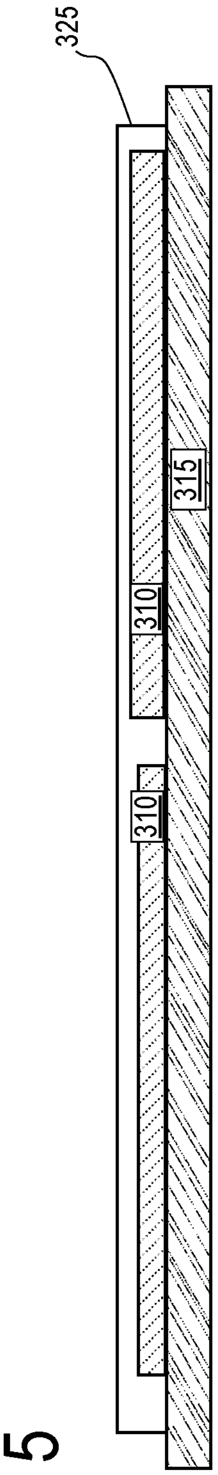
Figure 16:
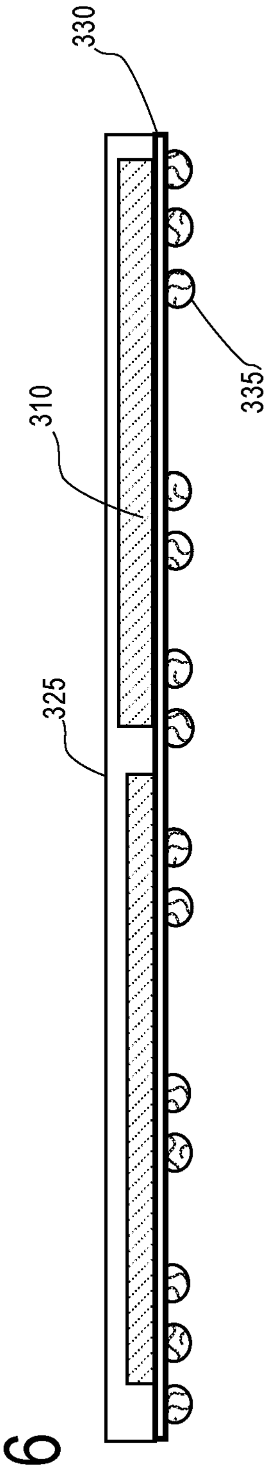

FIGS. 14-16 are cross-sectional side view diagrams of fabrication stages to show forming the top package of the stacked package structure of FIG. 1. In FIG. 14 two functional dies 310 are attached to temporary carrier 315. There may be a copper and adhesive layer as in FIG. 2. Any removable adhesive or attachment may be used.

In FIG. 15, a mold compound or encapsulant 325 is applied over the dies and the carrier. In FIG. 16, the temporary carrier is removed. RDL 330 is built up over the dies in place of the carrier and solder balls 335 or any other appropriate attachment is placed on appropriate pads of the RDL. The FIG. 16 package may next be placed over the FIG. 13 package so that the solder balls meet the pads or lands 232 of the FIG. 13 structure. The combination is then heated for solder reflow to provide the structure of FIG. 1

The resulting top package of FIG. 16 is similar to standard side-by-side eWLB (embedded Wafer-Level Ball Grid Array) packages. While two side-by-side dies are shown, there may be one die or multiple dies in any desired configuration and orientation. The dies may be of different sizes. The package differs from a standard package in that the RDL has solder balls that are placed specifically to connect with passive devices on the bottom package. The passive devices as shown in FIG. 13 are placed directly over the die in the bottom package so that the passive devices are sandwiched in between the bottom die and the top packages. Using the RDL, the passive devices may be coupled through the RDL to any desired pins or pads of either of the dies. This allows the passive devices to be used for a variety of different purposes as is appropriate depending on the nature of the dies of the top package.

The top package of FIGS. 1 and 16 are shown as examples. Any other type of package or bare die may be used to couple to the passive device contact pads of FIG. 13. There may be one more packages or bare dies may be used, depending on the intended use for the completed structure. A package substrate, interposer, or carrier may be used instead of the RDL as shown between the bottom package and the top package. As shown in FIG. 1, the bottom package provides a connection directly to the motherboard 102, to the bottom die, and also to the passive components between the top and bottom packages.

Figure 17:
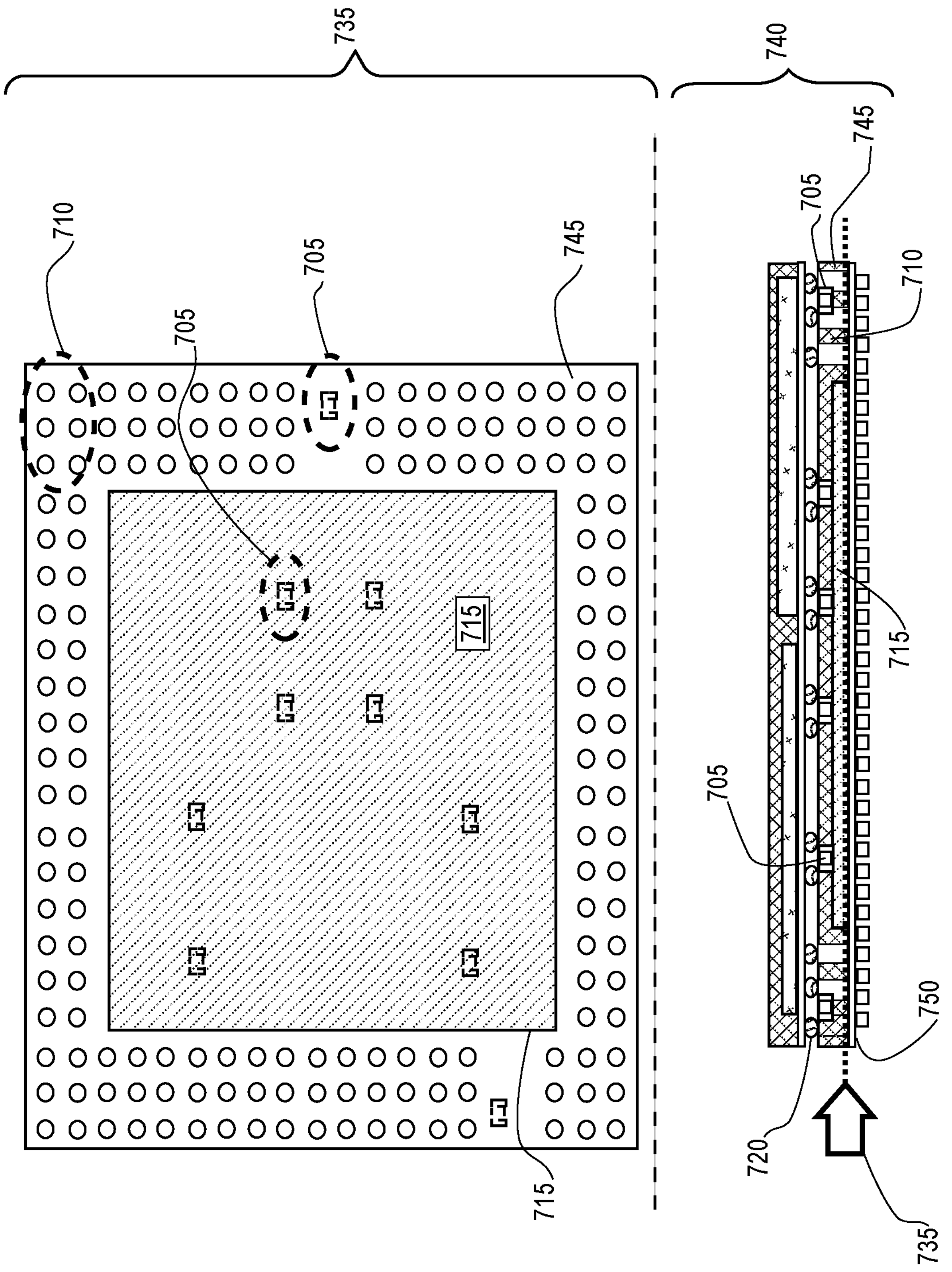
FIG. 17 is a bottom cross-sectional view of a bottom package according to an embodiment.

FIG. 17 is a bottom cross-sectional view of the bottom package of FIG. 1 taken through line 735. This line is through the die 715 of the bottom package and the vias 710 through the mold or encapsulant 745. The bottom view shows that the mold 745 surrounds and encapsulates the entire package 715 around the periphery of the die 715. There are multiple TMVs 710 through the mold to connect the package substrate or RDL 750 to the top package.

Passive devices 705 are shown for reference although these are not visible at the level of the cross-section line 735. As shown some of the passive devices are in the peripheral mold compound 745 and other passive devices are in the space used by the die. In particular they are over the die as shown in the side cross-sectional view for reference.

Figure 18:
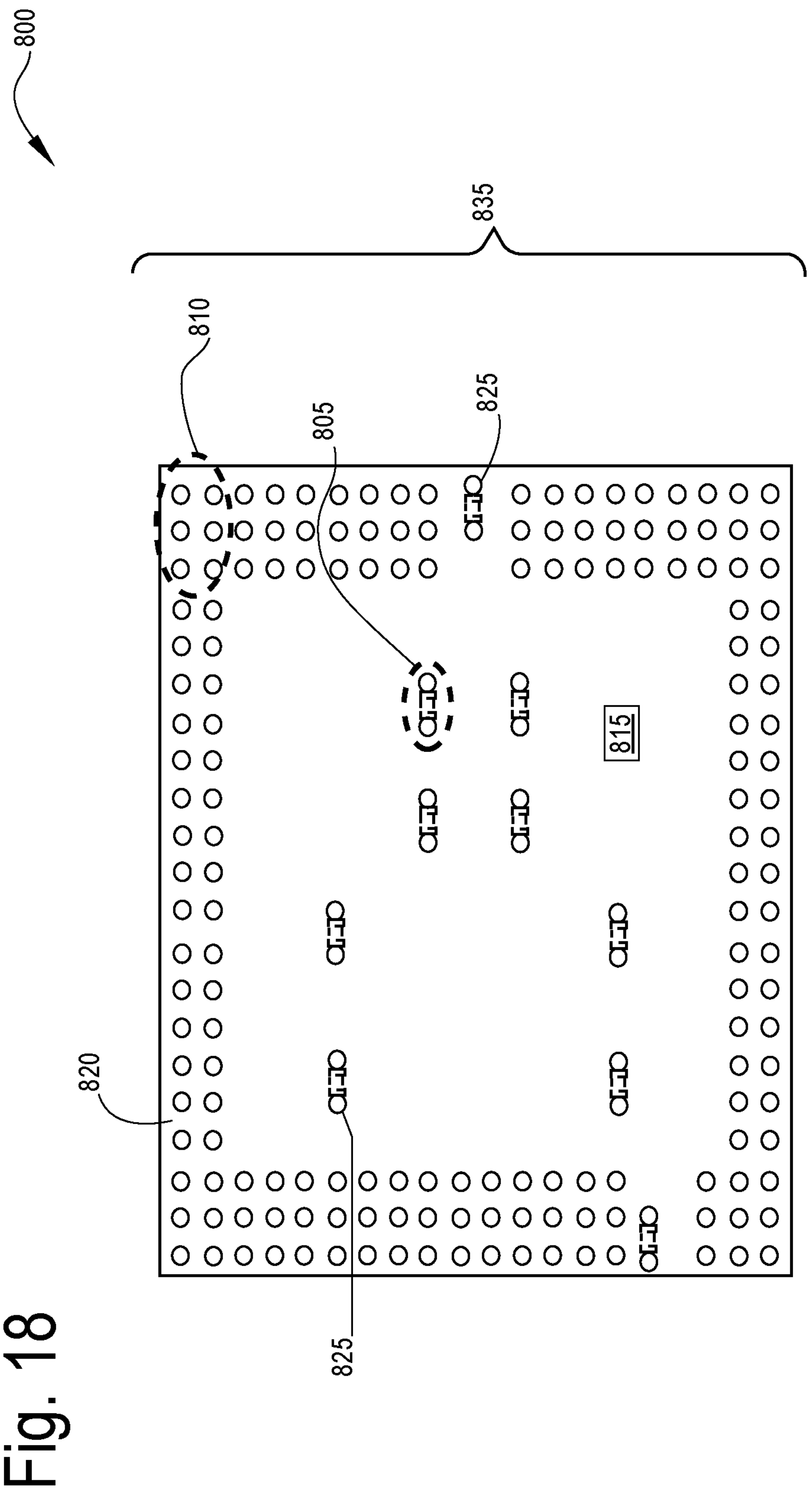
FIG. 18 is a top plan view of the top of a bottom package according to an embodiment.

FIG. 18 is a top plan view of the top of the bottom package 800 similar to that of FIGS. 1 and 13. The top of the package is covered in a dielectric layer 815 and the periphery is a mold compound 820. These are both covered in a patterned copper layer (shown in FIG. 13). Each of the vias 810 in the mold compound has a land or pad. Solder balls or another attachment may be applied to the lands or pad to connect to a top package or die. In addition the passive devices 805 both in the mold and over the die have lands or pads 825 on their terminal to connect to the top package or die. The passive devices are again shown as capacitors but any of a variety of different passive devices may be used. The passive devices are shown for reference. They are not visible in this top view due to the patterned copper, dielectric and mold compound that covers them.

Figure 19:
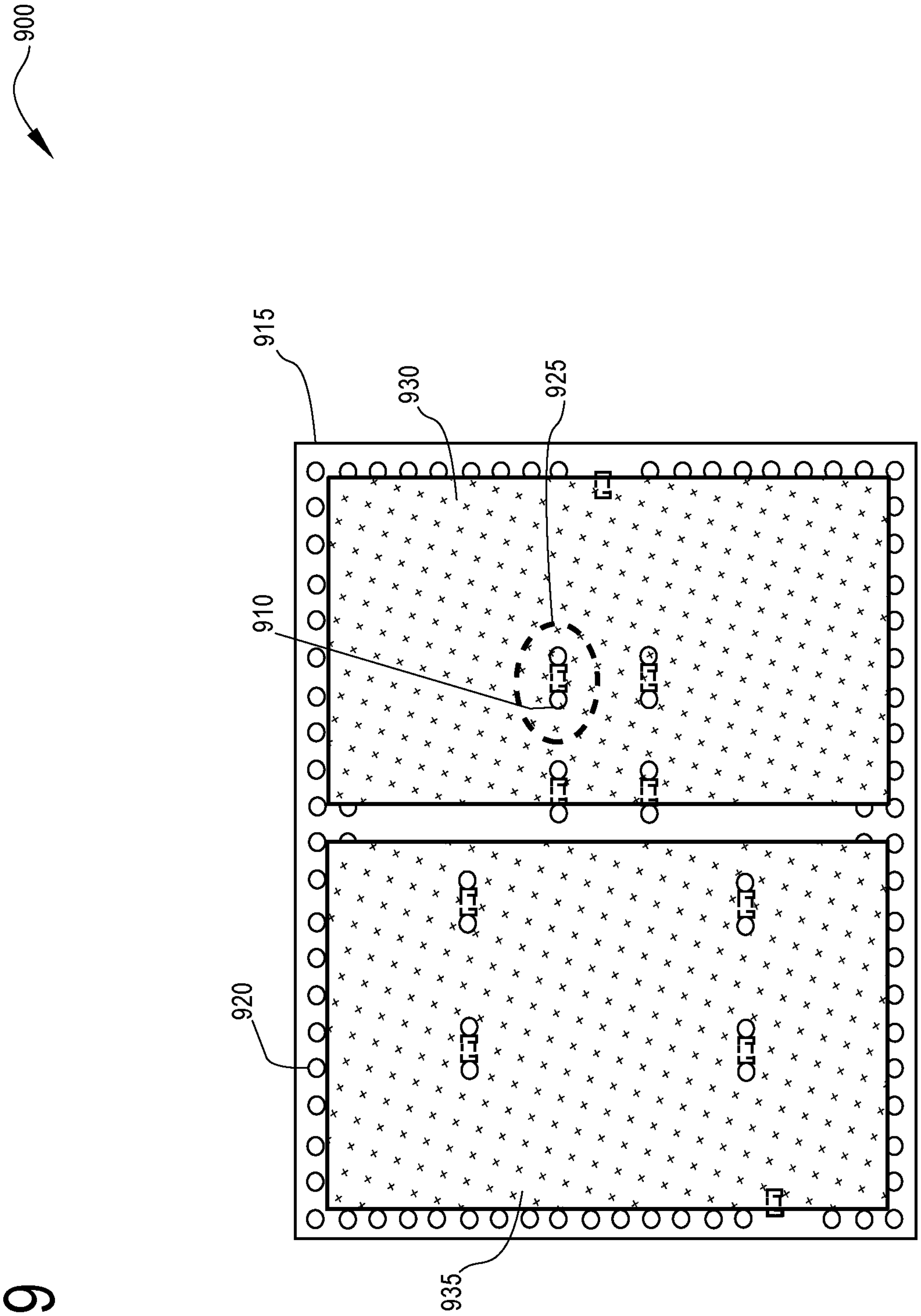
FIG. 19 is a bottom plan view of a top package according to an embodiment.

FIG. 19 is a bottom plan view diagram of the top package to show the placement of various components. The package has a substrate or RDL 915 to attach to the top surface of the bottom package. The RDL carries a first and second side-by-side functional die 930 which are placed on the opposite side of the RDL from the side shown in the diagram and so would not be visible through the RDL. The RDL has lands or pads 920 around the periphery of the dies that may be coupled through the RDL to one or both of the dies. The RDL may also have lands or pads directly beneath the dies to connect to one or both of the dies depending on the routing in the RDL.

In contrast to other types of package, the RDL also has terminals 910 to connect to the passive devices of the bottom package. The passive devices 925 are shown for reference in this diagram but are not located in the top package 900 but in the bottom package 800. These terminals of the RDL are then routed through the RDL 915 to an appropriate connection on one or both of the dies 930.

The described embodiments may be modified in any of a variety of different ways. The position and connections to the passive devices create a structure that efficiently uses PCB area and volume, maximizing space utilization, while simultaneously integrating both multiple silicon dies and discrete passive SMT components. In addition to the space-saving benefits, there is an electrical benefit. The unique placement of the passives provides a considerable reduction of the parasitic loop resistance and inductance between the dies and the passive discrete SMT components. Compared to placing the passive components on the PCB, the parasitic resistance and inductance may be reduced by an order of magnitude. These benefits are obtained, at least in part, by an optimal placement of the passive discrete SMT devices directly below the footprint of the top dies.

Figure 20:
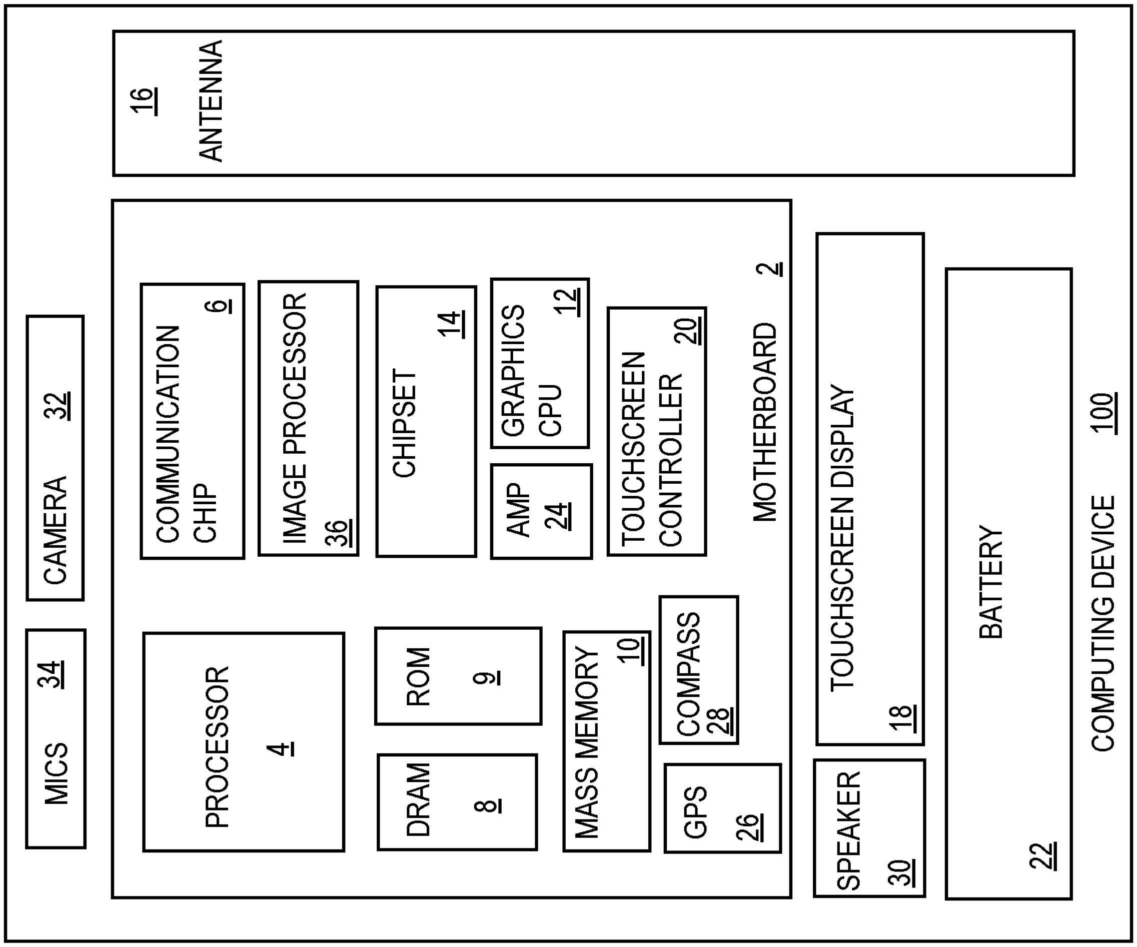
FIG. 20 is a block diagram of a computing device incorporating stacked packages on a system board according to an embodiment.

FIG. 20 is a block diagram of a computing device 100 in accordance with one implementation. The computing device 100 houses a system board 2. The board 2 may include a number of components, including but not limited to a processor 4 and at least one communication package 6. The communication package is coupled to one or more antennas 16. The processor 4 is physically and electrically coupled to the board 2.

Depending on its applications, computing device 100 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, cameras 32, a microphone array 34, and a mass storage device (such as hard disk drive) 10, compact disk (CD) (not shown), digital versatile disk (DVD) (not shown), and so forth). These components may be connected to the system board 2, mounted to the system board, or combined with any of the other components.

The communication package 6 enables wireless and/or wired communications for the transfer of data to and from the computing device 100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication package 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 100 may include a plurality of communication packages 6. For instance, a first communication package 6 may be dedicated to shorter range wireless communications such as Wi-Fi and Bluetooth and a second communication package 6 may be dedicated to longer range wireless communications such as GPS, EDGE, GPRS, CDMA, WiMAX, LTE, Ev-DO, and others.

The processor memory, graphics processor or communications chips may be combined and configured as shown in the above figures using stacked packages with passives between memory packages as described. Alternatively, or in addition, additional packages such as one of the DRAM, ROM, image processor, graphics processor, communications, or sensors may be stacked together with passive devices in between and then mounted to the system board 2. While the examples are directed to a stack of two packages and three dies, other combination may be used.

In various implementations, the computing device 100 may be a laptop, a netbook, a notebook, an ultrabook, a smartphone, a tablet, a personal digital assistant (PDA), an ultra mobile PC, a mobile phone, a desktop computer, a server, a set-top box, an entertainment control unit, a digital camera, a portable music player, or a digital video recorder. The computing device may be fixed, portable, or wearable. In further implementations, the computing device 100 may be any other electronic device that processes data or records data for processing elsewhere.

In the present description, numerous specific details are set forth such as examples of specific systems, languages, components, etc., in order to provide a thorough understanding of the various embodiments. It will be apparent, however, to one skilled in the art that these specific details need not be employed to practice the embodiments disclosed herein. In other instances, well known materials or methods have not been described in detail in order to avoid unnecessarily obscuring the disclosed embodiments.

References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

In addition to various hardware components depicted in the figures and described herein, embodiments further include various operations which are described herein. The operations described in accordance with such embodiments may be performed by hardware components or may be embodied in machine-executable instructions, which may be used to cause a general-purpose or special-purpose processor programmed with the instructions to perform the operations. Alternatively, the operations may be performed by a combination of hardware and software.

Any of the disclosed embodiments may be used alone or together with one another in any combination. Although various embodiments may have been partially motivated by deficiencies with conventional techniques and approaches, some of which are described or alluded to within the specification, the embodiments need not necessarily address or solve any of these deficiencies, but rather, may address only some of the deficiencies, address none of the deficiencies, or be directed toward different deficiencies and problems which are not directly discussed.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

While the subject matter disclosed herein has been described by way of example and in terms of the specific embodiments, it is to be understood that the claimed embodiments are not limited to the explicitly enumerated embodiments disclosed. To the contrary, the disclosure is intended to cover various modifications and similar arrangements as would be apparent to those skilled in the art. Therefore, the scope of the appended claims should be accorded the broadest interpretation so as to encompass all such modifications and similar arrangements. It is to be understood that the above description is intended to be illustrative, and not restrictive. Many other embodiments will be apparent to those of skill in the art upon reading and understanding the above description. The scope of the disclosed subject matter is therefore to be determined in reference to the appended claims, along with the full scope of equivalents to which such claims are entitled.

The following examples pertain to further embodiments. The various features of the different embodiments may be variously combined with some features included and others excluded to suit a variety of different applications. Some embodiments pertain to an apparatus that includes a die, a package substrate attached to the die on one side of the die and configured to be connected to a system board, a plurality of passive devices over a second side of the die, and a plurality of passive device contacts over a respective passive device, the contacts being configured to be coupled to a second die mounted over the passive devices and over the second side of the die.

In further embodiments the package substrate is a redistribution layer.

In further embodiments the contacts comprise copper pillars.

In further embodiments the passive devices are mounted to the die, the package further comprising a dielectric material over the die and between the passive devices.

In further embodiments the passive devices are embedded in the dielectric material.

In further embodiments the dielectric material is a mold compound.

Further embodiments include a molding compound over the die and the substrate to seal the die.

In further embodiments the mold compound includes through-mold vias between the substrate and a top surface of the mold compound.

In further embodiments the through-mold vias comprises copper pillars embedded in the mold compound.

Further embodiments include a second microelectronic die package over the passive device contacts, the second package having a plurality of package contacts to connect to the passive device contacts.

In further embodiments the second device contacts are solder balls on one side of a redistribution layer and wherein the redistribution layer is coupled to a second microelectronic die on an opposite side.

In further embodiments the second package comprises a mold compound over the redistribution layer and the second microelectronic die.

In further embodiments the second microelectronic die is over the passive devices and wherein the passive devices are coupled through the passive device contacts and the redistribution layer to the second microelectronic die.

Some embodiments pertain to a method of fabricating a microelectronic die package that includes attaching a die to a package substrate on one side of substrate, attaching a plurality of passive devices over the die on a second side of the die opposite the package substrate, forming a plurality of passive device contacts over each respective passive device, the contacts being configured to be coupled to a second die mounted over the passive devices and over the second side of the die, and attaching a ball grid array to the package substrate on a side opposite of the die and configured to be connected to a system board;

In further embodiments the contacts comprise copper pillars.

Further embodiments include applying a dielectric material over the die and between the passive devices so that the passive devices are embedded in the dielectric material.

In further embodiments the dielectric is a mold compound, the method further comprising forming through-mold vias between the substrate and a top surface of the mold compound.

Some embodiments pertain to a computing system that includes a system board, a first microelectronic die package having a first die, a package substrate attached to the first die on one side of the die and connected to the system board, a plurality of passive devices over a second side of the first die, and a plurality of passive device contacts over a respective passive device, and a second microelectronic die package over the passive device contacts, the second package having a plurality of package contacts to connect to the passive device contacts over the second side of the first die.

In further embodiments the passive devices are mounted to the die, the first package further comprising a dielectric material over the first die and between the passive devices, and wherein the passive devices are embedded in the dielectric material.

In further embodiments the dielectric material is a mold compound over the first die and the substrate to seal the first die.

The invention claimed is:

1. A device, comprising:

an upper package comprising a first die laterally spaced apart from a second die by a first mold compound, the mold compound having a portion between the first die and the second die with an uppermost surface above an uppermost surface of the first die and above an uppermost surface of the second die, and a first redistribution layer beneath the first die and the second die and the first mold compound;

a lower package, wherein the first redistribution layer of the upper package is coupled to the lower package by first solder balls, wherein the lower package comprises a third die, and vias adjacent to the third die, the vias having an uppermost surface at a different level than an uppermost surface of the third die, and the vias comprising a first via and a second via laterally spaced apart from a same side of the third die, wherein the first die is vertically overlapping with both the first via and the second via, wherein a first one of the first solder balls is vertically between the third die and the first die along a first vertical axis, and a second one of the first solder balls is vertically between the third die and the second die along a second vertical axis, wherein the lower package comprises a second redistribution layer beneath the third die and the vias, wherein the lower package comprises a second mold compound in contact with sidewalls and a top of the third die, and wherein the first die of the upper package extends laterally beyond a first one of the sidewalls of the third die, and the second die of the upper package extends laterally beyond a second one of the sidewalls of the third die, the second one of the sidewalls laterally opposite the first one of the sidewalls; and second solder balls coupled to the second redistribution layer, the second solder balls beneath the third die and the vias.

2. The device of claim 1, wherein the upper package has a first sidewall and a second sidewall laterally opposite the first sidewall, wherein the lower package has a first sidewall and a second sidewall laterally opposite the first sidewall, wherein the first sidewall of the upper package is in vertical alignment with the first sidewall of the lower package, and wherein the second sidewall of the upper package is in vertical alignment with the second sidewall of the lower package.

3. The device of claim 1, wherein the upper package has a first sidewall and a second sidewall laterally opposite the first sidewall, wherein the lower package has a first sidewall and a second sidewall laterally opposite the first sidewall, wherein the first die is closer to the first sidewall of the upper package than the third die is to the first sidewall of the lower package, and wherein the second die is closer to the second sidewall of the upper package than the third die is to the second sidewall of the lower package.

4. The device of claim 1, wherein the upper package further comprises an additional die.

5. The device of claim 1, wherein a portion of one or more of the vias of the lower package has a vertical thickness less than a vertical thickness of the second mold compound.

6. The device of claim 1, further comprising:

a board beneath the second solder balls.

7. The device of claim 6, further comprising:

a package substrate intervening between the board and the second solder balls.

8. A device, comprising:

an upper package comprising a first die laterally spaced apart from a second die by a first region of encapsulant, the first region of encapsulant having an uppermost surface above an uppermost surface of the first die and above an uppermost surface of the second die, and a first layer of connections beneath the first die and the second die and the first region of encapsulant;

a lower package, wherein the first layer of connections of the upper package is coupled to the lower package by first solder balls, wherein the lower package comprises a third die, and vias adjacent to the third die, the vias having an uppermost surface at a different level than an uppermost surface of the third die, and the vias comprising a first via and a second via laterally spaced apart from a same side of the third die, wherein the first die is vertically overlapping with both the first via and the second via, wherein a first one of the first solder balls is vertically between the third die and the first die along a first vertical axis, and a second one of the first solder balls is vertically between the third die and the second die along a second vertical axis, wherein the lower package comprises a second layer of connections beneath the third die and the vias, and wherein the lower package comprises a second region of encapsulant in contact with sidewalls and a top of the third die, and wherein the first die of the upper package extends laterally beyond a first one of the sidewalls of the third die, and the second die of the upper package extends laterally beyond a second one of the sidewalls of the third die, the second one of the sidewalls laterally opposite the first one of the sidewalls; and second solder balls coupled to the second layer of connections, the second solder balls beneath the third die and the vias.

9. The device of claim 8, wherein the upper package has a first lateral width, wherein the lower package has a second lateral width, and wherein the second lateral width is the same as and is aligned with the first lateral width.

10. The device of claim 8, wherein the first die is closer to a first edge of the upper package than the third die is to a first edge of the lower package, and wherein the second die is closer to a second edge of the upper package than the third die is to a second edge of the lower package.

11. The device of claim 8, wherein the upper package further comprises one or more additional dies.

12. The device of claim 8, wherein a portion of one or more of the vias of the lower package has a vertical thickness less than a vertical thickness of the second region of encapsulant.

13. The device of claim 8, further comprising:

a board beneath the second solder balls.

14. A device, comprising:

a first die laterally spaced apart from a second die by a first mold compound, the first mold compound having a portion between the first die and the second die with an uppermost surface above an uppermost surface of the first die and above an uppermost surface of the second die;

a first redistribution layer beneath the first die and the second die and the first mold compound;

a third die beneath the first redistribution layer, wherein the first die extends laterally beyond a first sidewall of the third die, and the second die extends laterally beyond a second sidewall of the third die, the second sidewall laterally opposite the first sidewall;

first solder balls including a first solder ball vertically between the third die and the first die along a first vertical axis, and a second solder ball vertically between the third die and the second die along a second vertical axis;

vias adjacent to the third die, the vias having an uppermost surface at a different level than an uppermost surface of the third die, and the vias comprising a first via and a second via laterally spaced apart from a same side of the third die, wherein the first die is vertically overlapping with both the first via and the second via;

a second redistribution layer beneath the third die and the vias;

a second mold compound in contact with sidewalls and a top of the third die; and second solder balls coupled to the second redistribution layer, the second solder balls beneath the third die and the vias.

15. The device of claim 14, wherein the first mold compound has a first sidewall and a second sidewall laterally opposite the first sidewall, wherein the second mold compound has a first sidewall and a second sidewall laterally opposite the first sidewall, wherein the first sidewall of the first mold compound is in vertical alignment with the first sidewall of the second mold compound, and wherein the second sidewall of the first mold compound is in vertical alignment with the second sidewall of the second mold compound.

16. The device of claim 14, wherein the first mold compound has a first sidewall and a second sidewall laterally opposite the first sidewall, wherein the second mold compound has a first sidewall and a second sidewall laterally opposite the first sidewall, wherein the first die is closer to the first sidewall of the first mold compound than the third die is to the first sidewall of the second mold compound, and wherein the second die is closer to the second sidewall of the first mold compound than the third die is to the second sidewall of the second mold compound.

17. The device of claim 14, wherein the first mold compound has a first lateral width, wherein the second mold compound has a second lateral width, and wherein the second lateral width is the same as and is aligned with the first lateral width.

18. The device of claim 14, further comprising:

a board beneath the second solder balls.

* * * * *